United States Patent [19]

Bossard

[11] Patent Number: 4,825,152

[45] Date of Patent: Apr. 25, 1989

[54] TRANSIENT FIELD INDICATOR

[75] Inventor: Peter R. Bossard, Langhorne, Pa.

[73] Assignee: Voyager Technologies, Inc., Langhorne, Pa.

[21] Appl. No.: 855,074

[22] Filed: Apr. 22, 1986

[51] Int. Cl.⁴ ............................................. G01R 13/14
[52] U.S. Cl. .................................. 324/95; 250/475.2; 324/72; 324/260; 324/457; 346/74.2; 346/150; 346/153.1
[58] Field of Search ................... 324/102, 95, 96, 112, 324/113, 51, 72, 457, 260; 340/600, 662, 657, 659; 343/703; 250/475.2, 482.1, 250; 354/3; 346/335, 162, 163, 164, 150, 153.1, 74.2, 74.4; 355/3 R

[56] References Cited

U.S. PATENT DOCUMENTS

| | | | |
|---|---|---|---|
| 1,649,180 | 11/1927 | Peters | 340/659 X |
| 1,702,412 | 2/1929 | Peters | 346/162 |
| 1,825,551 | 9/1931 | Serrell | 346/164 X |
| 2,870,407 | 1/1959 | Baker | 324/112 X |
| 3,778,145 | 12/1973 | McClure | 346/74.2 X |
| 4,023,093 | 5/1977 | Aslan | 324/95 X |
| 4,329,580 | 5/1982 | Riley et al. | 324/96 X |
| 4,629,978 | 12/1986 | Aslan | 324/95 |

OTHER PUBLICATIONS

Electronics, Iizuka, "Making It In Pictures", Apr. 15, 1968, pp. 130–131.
Microwave Journal, Kernweis et al., "Liquid Crystal Diagnostic Techniques—an Antenna Design Aid", Oct. 1977, pp. 47–51.

Primary Examiner—Jerry Smith
Assistant Examiner—Stephen M. Baker
Attorney, Agent, or Firm—Marmorek, Guttman & Rubenstein

[57] ABSTRACT

A photographic film is adapted to provide visual record of the occurrence of a transient electrostatic or transient magnetic field by the inclusion of metallic patterns close to the film. The patterns are of a geometry to define gaps at which the fields are concentrated in a manner to interact with the film. The film exhibits a light spot at the gap, when it is developed, if a field of sufficient intensity is present during the test period. The film packet is intended primarily for inclusion in the shipping package for sensitive electronic devices to provide a visual record of exposures during shipment.

8 Claims, 1 Drawing Sheet

TRANSIENT FIELD INDICATOR

FIELD OF THE INVENTION

This invention relates to means for providing a permanent record of the occurrence of an electrostatic or magnetic field.

BACKGROUND OF THE INVENTION

The damage to electronic devices due to the occurrence of electrostatic forces is well known. These forces accumulate on a worker handling such devices without any awareness that the charges are accumulating. Constant effort is necessary to guard against such charges and monitoring devices such as wrist strap and mat checkers are becoming familiar in the factory environment.

In spite of precautions and frequent testing, damage still occurs. Frequently, just packaging devices for shipment or the handling of devices during shipment causes electrostatic charge to accumulate. Frequently, devices tested prior to shipment arrive defective requiring further testing upon arrival or risk of damage to other circuit components because of the use of defective devices. Either option is costly. The presence of a magnetic field during shipment similarly causes damage to sensitive electronic equipment.

BRIEF DESCRIPTION OF THE INVENTION

In accordance with the principle of this invention, an antenna is formed in energy coupled relationship to an event-recording medium. The occurrence of, for example, an electrostatic discharge during shipment is picked up by the antenna and recorded on the medium. The medium may comprise a photographic film and an electrostatic field antenna may comprise two T-shaped deposited metallic patterns with the bases of the T's being spaced apart a small distance to define an area in which a discharge occurs. Any discharge which does occur, appears on the film when developed. A self-developing film packet is most convenient in this connection.

In accordance with another aspect of this invention, a metallic (magnetoresistive) pattern is formed in energy coupling relationship to a medium to 'focus' any magnetic field which occurs during shipment. The pattern is conveniently in the form of a ring or loop with a small section missing to form a gap. The ring is operative to concentrate the field at the gap again causing a response which appears on the film when developed. If an unwanted electrostatic discharge or magnetic field occurs during shipment, these little indicators provide visual records of the events.

DETAILED DESCRIPTION

Figure 1:
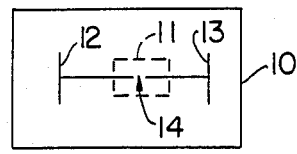
FIGS. 1, 2, 3, 4 and 7 are schematic top views of electrostatic and magnetic field event recorders in accordance with the principle of this invention.

FIG. 1 shows an embodiment of this invention comprising a rectangular piece of paper, 10, which serves as a base for positioning a film sensitive to electric fields and metallic forms for defining a gap which acts as an antenna to concentrate the energy of a field at the film. A suitable film is a photographic film represented by dashed rectangle 11. The energy concentrating elements are shown as T-shaped metallic films 12 and 13 forming gap 14 between them.

In principle, undeveloped film 11 is enclosed in an envelope on an inner face of which the film and the metallic forms are defined. The envelope is placed in the package in which sensitive electronic devices are shipped. The envelope is removed from the package at the destination and developed. If electrostatic fields were present during shipment, the film (when developed) will record a bright spot at the gap. If the envelope is taken to be the same size as paper 10 in FIG. 1, then rectangle 10 can be taken as representing the envelope.

Figure 2:
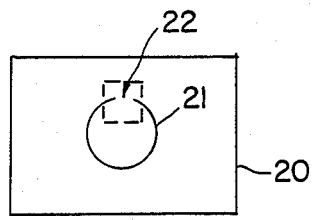

A similar arrangement can be made to detect the occurrence of a transient magnetic field. FIG. 2 shows one such arrangement. Specifically FIG. 2 shows a supporting layer 20 which again may comprise the inner face of an envelope. The metallic form in this instance is a ring or loop 21 which is open at one point to define a gap 22. A small piece of film 23 is secured to the inner face of the material at the gap. The presence of a magnetic field within the ring causes currents in the ring which are concentrated at the gap to an intensity which affects the film and produces a bright spot which appears when the film is developed.

Figure 3:
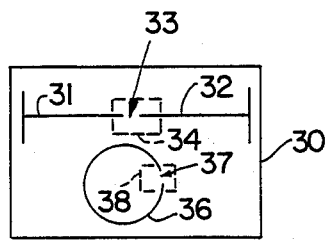

A single envelope may contain both an electric field recording arrangement and a magnetic field recording arrangement. This is illustrated in FIG. 3. FIG. 3 shows an inner face of an envelope 30 on which T-shaped metallic forms 31 and 32 are defined. The T-shaped forms are spaced apart at their bases to define a gap 33. A film 34 is secured to the inner face of the envelope at the gap in an energy coupling relationship to be exposed by the presence of the field of an intensity dictated by the width of the gap and the thickness and width of the metallic forms at the gap as will be discussed more fully hereinafter.

FIG. 3 also shows a ring 36. Ring 36 has a portion missing to define gap 37 which is positioned in energy coupling relationship to film 38. The presence of a transient magnetic field causes currents in the ring. Those currents generate a high intensity field in the gap which produce a bright spot on the film when the film is later developed.

The embodiments of FIGS. 1, 2 or 3 can be implemented in a variety of ways. In one instance, a piece of photographic film may be used as a support and metallic layers of the desired forms may be formed directly on the film. Well known photo-etching as silk screening techniques may be used. Alternatively, the photographic film may comprise a self-developing film pack such as a Poloroid$^R$ film with the metallic forms defined on the outside surface of the package. The metallic forms may even be defined on opposite outside surfaces of a self-developing film pack. In this latter case, the basis of the T-shaped elements may actually overlap one another being separated by the film pack itself to form a suitable gap.

Figure 5:
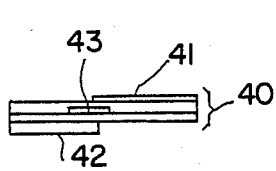
FIGS. 5 and 6 are schematic edge views of event recorders of the type shown in FIGS. 1 through 4 where portions of the antenna are on opposite sides of a recording medium.
Figure 4:
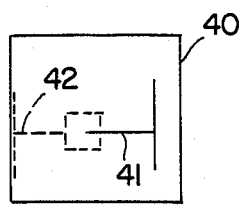
Figure 6:
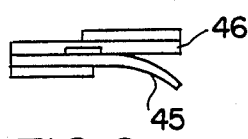

FIGS. 4, 5 and 6 illustrate the embodiment where a film pack has T-shaped forms defined on the outside surface of the pack. FIG. 4 shows the envelope or pack 40 including T-shaped element 41 on the facing surface and T-shaped element 42 on the hidden surface. The resulting sandwich structure is shown in a side view in FIG. 5. The film is represented at 43 and is shown positioned between the overlapping bases of T-shaped element 42 and 43. The envelope is opened upon arrival at its destination as represented in FIG. 6. The film is self-developing and exhibits a bright spot at the gap position if a field were present during shipment. FIG. 6 shows portion 45 of envelope 40 being peeled away from portion 46 in the same manner in which a self-developing film pack is opened for development. Of course a film with the appropriate metallic forms on its surface or surfaces, may be enclosed in an opaque envelope for later development upon arrival.

The bright spot which shows up on a film upon development is determined by the intensity of the field produced at the gap in either of the embodiment of FIG. 1 or FIG. 2 for example. Accordingly, a variety of different gaps may be defined in a single test pattern. This would be particularly handy if it were known that fields below a known intensity would be insufficient to damage the devices being shipped but a record of the occurrence of such fields was desired. A single photographic film would then be adapted to be in energy coupling relationship with a number of metallic elements defining gaps of different sizes which produce fields of different intensities.

Figure 7:
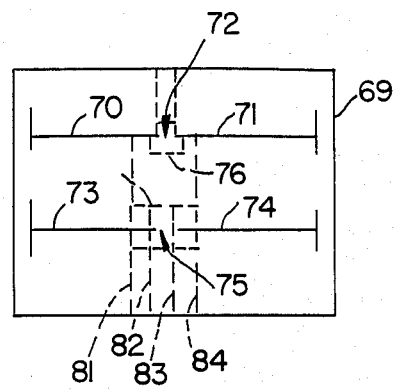

Alternatively, a separate piece of film could be related to each pair of elements which define a gap. This latter arrangement is illustrated in FIG. 7. FIG. 7 shows an envelope 69 in which elements 70 and 71 define a gap 72 of a first width and elements 73 and 74 define a gap 75 of a second width larger than the first. Films 76 and 77 are positioned at gaps 72 and 75 respectively.

The metallic elements are of a material and have a width and thickness to ensure that they define low resistance paths for currents so that the only significant voltage drop occurs across the gap when an electric (or magnetic) field occurs for the embodiments of FIG. 1 or FIG. 2 respectively. The metallic elements are made of gold or aluminum for durability and typically would have a cross section dimension of 5 mils by 10 mils. The gap would have a width of about 10 mils to provide sufficiently high field intensities to affect the photographic film. The film typically would be from one centimeter to one tenth centimeter in diameter or on a side and could have an ASA number of from 100 to 10,000. In one specific example a Polaroid pack including a film with an ASA of 1000 was provided with T-shaped elements each $0.010 \times 0.0005$ in cross section with a base 4 inches long and a top 6 inches long. The elements were formed on opposite surfaces of the package and overlapped at their bases to define a gap of 0.050 inch. An electrostatic field of 1000 volts was generated on the T-shaped limits and provided a spot ¼ inch in diameter.

A predefined grid on the film may be used to provide a ready reference for measuring spot size for determining the occurrence of a damaging field during shipment. FIG. 7 shows vertical dashed lines 81, 82, 83 and 84 indicating such a grid.

It is not necessary for the film to be a photographic film. A thin film of chromium ($20 \times 10^{10-}$meters) may be used for example. Such a film would exhibit cracks under ultra violet light. Similarly, various dyes can be used also with uv light. The dyes would be coated by a moisture barrier such as polyethelene. Also the film may be placed directly on a circuit in which case particularly it may be desirable to use a curable film. Further, it is not necessary for the loop (i.e. 21 in FIG. 2) to be circular. It is only necessary that it be a loop with a section missing to concentrate the field.

What is claimed is:

1. In combination, a film and an antenna in energy coupling relationship with said film, said antenna having a geometry to define a gap and being responsive to the presence of a field to concentrate the energy of said field at said gap, said film being responsive to said concentrated energy at said gap to provide an indication thereof; said film being an undeveloped photographic film and said antenna comprising first and second metallic depositions extending along said film and being closely spaced apart from one another in a manner to form a single gap therebetween; wherein said field is electric and each of said first and second metallic depositions has a T-shape and the bases of the T-shapes are closely spaced apart to form said gap.

2. In combination, a film and an antenna in energy coupling relationship with said film, said antenna having a geometry to define a gap and being responsive to the presence of a field to concentrate the energy of said field at said gap, said film being responsive to said concentrated energy at said gap to provide an indication thereof; said film being an undeveloped photographic film and said antenna comprising first and second metallic depositions extending along said film and being closely spaced apart from one another in a manner to form a single gap therebetween; said field being electric and each of said first and second metallic depositions having a T-shape and the bases of the T-shapes being closely spaced apart to form said gap; said first and second depositions being formed on opposite faces of said film.

3. A combination in accordance with claim 2 wherein said film has a covering layer and is adapted to self develop when said covering layer is removed.

4. A combination in accordance with claim 3 wherein said first and second metallic depositions are formed on the outward facing surfaces of said film.

5. In combination, a film and an antenna in energy coupling relationship with said film, said antenna having a geometry to define a gap and being responsive to the presence of a field to concentrate the energy of said field at said gap, said film being responsive to said concentrated energy at said gap to provide an indication thereof; said film being an undeveloped photographic film and said antenna comprising first and second metallic depositions extending along said film and being closely spaced apart from one another in a manner to form a single gap therebetween; further including an opaque envelope enclosing said film.

6. In combination, a film and an antenna in energy coupling relationship with said film, said antenna having a geometry to define a gap and being responsive to the presence of a field to concentrate the energy of said field at said gap, said film being responsive to said concentrated energy at said gap to provide an indication thereof; said film being an undeveloped photographic film and said antenna comprising first and second metallic depositions extending along said film and being closely spaced apart from one another in a manner to form a single gap therebetween; wherein said film has a covering layer and is adapted to self develop when said covering layer is removed.

7. In combination, a film and an antenna in energy coupling relationship with said film, said antenna having a geometry to define a gap and being responsive to the presence of a field to concentrate the energy of said field at said gap, said film being responsive to said concentrated energy at said gap to provide an indication thereof; said film being an undeveloped photographic film and said antenna comprising first and second metallic depositions extending along said film and being closely spaced apart from one another in a manner to form a single gap therebetween; wherein said field has an associated magnetic flux; wherein said antenna comprises a metallic material having a geometry to define a gap for concentrating the energy associated with the magnetic flux; and wherein said antenna has the shape of a loop, said loop having a segment missing for defining said gap.

8. In combination, a film and first and second antenna in energy coupling relationship with said film; said first antenna comprising first and second metallic shapes spaced apart in a manner to form a first gap therebetween and being responsive to the occurrence of an electric discharge to concentrate the resulting electric field at said first gap; said second antenna comprising a material responsive to the presence of a magnetic field, said second antenna having a geometry to form a second gap and being adapted to concentrate said magnetic field as a current at said second gap.

* * * * *